United States Patent
Park et al.

(10) Patent No.: US 12,066,503 B2
(45) Date of Patent: Aug. 20, 2024

(54) BUS BAR FOR BATTERY CELL CONNECTION, BATTERY PACK, AND MANUFACTURING METHOD THEREFOR

(71) Applicant: LG CHEM, LTD., Seoul (KR)

(72) Inventors: Ji Soo Park, Daejeon (KR); Choon Kwon Kang, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 736 days.

(21) Appl. No.: 17/256,909

(22) PCT Filed: Feb. 4, 2020

(86) PCT No.: PCT/KR2020/001629
§ 371 (c)(1),
(2) Date: Dec. 29, 2020

(87) PCT Pub. No.: WO2020/171426
PCT Pub. Date: Aug. 27, 2020

(65) Prior Publication Data
US 2021/0278479 A1 Sep. 9, 2021

(30) Foreign Application Priority Data
Feb. 22, 2019 (KR) .................. 10-2019-0021176

(51) Int. Cl.
*G01R 31/66* (2020.01)
*G01R 19/165* (2006.01)
(Continued)

(52) U.S. Cl.
CPC ....... *G01R 31/66* (2020.01); *G01R 19/16542* (2013.01); *H01M 50/204* (2021.01);
(Continued)

(58) Field of Classification Search
CPC .............. G01R 31/66; G01R 19/16542; G01R 31/3865; G01R 31/67; H01M 50/204;
(Continued)

(56) References Cited

U.S. PATENT DOCUMENTS

| | | |
|---|---|---|
| 2011/0076543 A1 | 3/2011 | Ro |
| 2011/0281151 A1 | 11/2011 | Lee |

(Continued)

FOREIGN PATENT DOCUMENTS

| | | | | |
|---|---|---|---|---|
| CN | 1757138 A | * | 4/2006 | ........... B23K 11/004 |
| CN | 1992390 A | * | 7/2007 | ............ H01M 2/202 |

(Continued)

OTHER PUBLICATIONS

International Search Report issued in corresponding International Patent Application No. PCT/KR2020/001629, dated May 19, 2020.
(Continued)

*Primary Examiner* — Kaity V Chandler
(74) *Attorney, Agent, or Firm* — Morgan, Lewis & Bockius LLP

(57) ABSTRACT

The present disclosure relates to a busbar for connecting battery cells, a battery pack, and a method for manufacturing the battery pack, and more particularly, to a busbar for electrically connecting a plurality of battery cells, a battery pack and a method for manufacturing the battery pack. In accordance with an exemplary embodiment, a battery pack includes: a plurality of battery cells; and a busbar for electrically connecting the plurality of battery cells, wherein the busbar includes: a lead part extending onto each of electrode terminals of the battery cells; a first welding protrusion formed on the lead part and joined to each of the electrode terminals; and a second welding protrusion formed on the lead part and disposed to be spaced apart from each of the electrode terminals.

17 Claims, 3 Drawing Sheets

(51) Int. Cl.
*H01M 50/204* (2021.01)
*H01M 50/213* (2021.01)
*H01M 50/50* (2021.01)
*H01M 50/503* (2021.01)
*H01M 50/505* (2021.01)
*H01M 50/566* (2021.01)
*H01M 50/569* (2021.01)
*B23K 101/38* (2006.01)

(52) U.S. Cl.
CPC ......... *H01M 50/213* (2021.01); *H01M 50/50* (2021.01); *H01M 50/503* (2021.01); *H01M 50/505* (2021.01); *H01M 50/566* (2021.01); *H01M 50/569* (2021.01); *B23K 2101/38* (2018.08)

(58) Field of Classification Search
CPC .. H01M 50/213; H01M 50/50; H01M 50/503; H01M 50/505; H01M 50/566; H01M 50/569; H01M 10/052; H01M 50/516; H01M 50/528; H01M 50/20; H01M 50/502; B23K 2101/38; Y02E 60/10
See application file for complete search history.

(56) References Cited

U.S. PATENT DOCUMENTS

| | | | |
|---|---|---|---|
| 2014/0038001 A1* | 2/2014 | Cai | H01M 50/578 |
| | | | 429/53 |
| 2016/0056514 A1* | 2/2016 | Ahn | H01M 50/567 |
| | | | 429/120 |
| 2016/0093863 A1* | 3/2016 | DeKeuster | H01M 50/553 |
| | | | 429/121 |
| 2016/0181579 A1 | 6/2016 | Geshi et al. | |
| 2016/0301056 A1 | 10/2016 | Yi | |
| 2018/0034020 A1* | 2/2018 | Neuss | H01M 10/0525 |
| 2019/0006776 A1* | 1/2019 | Newman | H01R 11/287 |
| 2019/0280256 A1* | 9/2019 | Baik | H01M 50/55 |

FOREIGN PATENT DOCUMENTS

| | | | | |
|---|---|---|---|---|
| CN | 201508864 U | * | 6/2010 | ............ Y02E 60/10 |
| CN | 105428583 A | * | 3/2016 | ............ Y02E 60/10 |
| CN | 206022495 U | | 3/2017 | |
| CN | 110277518 A | * | 9/2019 | ............ H01M 50/20 |
| JP | 2002141051 A | * | 5/2002 | ............ B23K 11/11 |
| JP | 2002-184371 A | | 6/2002 | |
| JP | 2003123729 A | * | 4/2003 | ............ Y02E 60/10 |
| JP | 2006-99997 A | | 4/2006 | |
| JP | 10-2007-0081533 A | | 8/2007 | |
| JP | 2010-118276 A | | 5/2010 | |
| JP | 2015198071 A | * | 11/2015 | ............ Y02E 60/10 |
| JP | 2016072041 A | * | 5/2016 | ............ Y02E 60/10 |
| KR | 10-2007-0081533 A | | 8/2007 | |
| KR | 10-2011-0035474 A | | 4/2011 | |
| KR | 10-2011-0125160 A | | 11/2011 | |
| KR | 10-2016-0059789 A | | 5/2016 | |
| KR | 10-2016-0120996 A | | 10/2016 | |
| KR | 10-2018-0053152 A | | 5/2018 | |
| TW | 201421780 A | | 6/2014 | |
| WO | WO-2014178130 A1 | * | 11/2014 | ............ H01M 2/206 |
| WO | WO-2015030541 A1 | * | 3/2015 | ............ B23K 11/11 |
| WO | WO-2019239919 A1 | * | 12/2019 | ......... H01M 50/204 |

OTHER PUBLICATIONS

First Office Action dated May 22, 2024 issued in corresponding First Office Action of Taiwanese Patent Application No. 109104777.

* cited by examiner

BUS BAR FOR BATTERY CELL CONNECTION, BATTERY PACK, AND MANUFACTURING METHOD THEREFOR

TECHNICAL FIELD

The present disclosure relates to a busbar for connecting battery cells, a battery pack, and a method for manufacturing the battery pack, and more particularly, to a busbar for electrically connecting a plurality of battery cells, a battery pack and a method for manufacturing the battery pack.

BACKGROUND ART

In general, the secondary batteries mean chemical batteries which can be repeatedly charged and discharged by using reversible mutual conversion between chemical energy and electrical energy. High performance secondary batteries include Ni-MH secondary batteries and lithium secondary batteries, and the lithium secondary batteries include lithium metal secondary batteries, lithium ion secondary batteries (prismatic type, cylindrical type, and pouch type), lithium ion polymer secondary batteries, and the like.

Among these secondary batteries, demand for small size secondary batteries has rapidly increased around the lithium-based secondary batteries while conveniently portable information technology (IT) products, such as smart phones, laptop computers, and personal digital assistants (PDAs) are widely used, and the lithium ion secondary batteries or the lithium ion polymer secondary batteries lead the second battery market among the small size secondary batteries according to the demand for small sizes, small weights, and high performance of the IP apparatuses.

According to the types of external apparatuses using the secondary batteries, the secondary batteries may be used as a single battery form, and also be used as a battery pack form in which a plurality of unit battery cells are electrically connected. For example, small devices such as mobile phones are capable of operating for a predetermined time with the output and capacity of a single battery cell, while as middle or large-sized devices, such as laptop computers, portable DVDs, small PCs, electric vehicles, and hybrid electric vehicles, are inevitably required to use battery packs due to the problem of output and capacity.

In order to electrically connect a plurality of battery cells, battery packs are provided with busbars composed of metal plates or the like, and the busbars electrically connect a plurality of battery cells such that a plurality of lead parts extending to one side or both sides are respectively welded to electrode terminals of the battery cells.

However, in such welding processes, when welding defects occur between the busbars and the electrode terminals of the battery cells, a problem occurs in which the manufactured battery packs should be entirely discarded. The larger the capacity of a battery pack, the more the number of the battery cells in which terminals should be welded, and thus, when the battery packs are entirely discarded, a big loss occurs in aspect of cost. In order to solve these problems, a countermeasure for minimizing welding defects, but when welding defects occur, a countermeasure ready for the problems are being strongly demanded.

RELATED ART DOCUMENTS (Patent document 1) KR10-2016-0059789 A

DISCLOSURE OF THE INVENTION

Technical Problem

The present disclosure provides: a busbar for connecting battery cells capable of connecting a plurality of battery cells in an electrically safe manner even when a welding defect occurs; a battery pack, and a method for manufacturing the battery pack.

Technical Solution

In accordance with an exemplary embodiment, a busbar for connecting battery cells includes: a body part composed of a conductive material; a lead part extending from the body part; a first welding protrusion protruding from the lead part so as to be welded to electrode terminals of the battery cells; and a second welding protrusion protruding from the lead part so as to be welded to the electrode terminals, wherein the second welding protrusion is formed to protrude lower than the first welding protrusion.

The first welding protrusion and the second welding protrusion may be formed so as to face the electrode terminals.

In accordance with another exemplary embodiment, a busbar for connecting battery cells includes: a body part composed of a conductive material; a lead part extending from the body part; a first welding protrusion protruding from the lead part so as to be welded to electrode terminals of the battery cells; and a second welding protrusion protruding from the lead part so as to be welded to the electrode terminals, wherein the second welding protrusion is formed to protrude in a different direction from the first welding protrusion.

The lead part may include: a first lead facing the electrode terminals of the battery cells; and a second lead disposed to be bent from the first leads, wherein the first welding protrusion and the second welding protrusion may be formed on the first lead and the second lead, respectively.

The second welding protrusion may be disposed so as to be closer to the body part than the first welding protrusion.

A guide groove may be formed in at least one surface of each of the lead part in a direction crossing a direction in which the lead part extends from the body part.

The guide groove may include: a first guide groove positioned between the first welding protrusion and the second welding protrusion; and a second guide groove positioned between the second welding protrusion and the body part.

At least one of the first guide groove and the second guide groove may be formed in plurality.

In accordance with yet another exemplary embodiment, a battery pack includes: a plurality of battery cells; and a busbar for electrically connecting the plurality of battery cells, wherein the busbar includes: a lead part extending onto electrode terminals of the battery cells; a first welding protrusion formed on the lead part and joined to the electrode terminals; and a second welding protrusion formed on the lead part and disposed so as to be spaced apart from the electrode terminals.

The first welding protrusion and the second welding protrusions may be formed to face the electrode terminals, and the second welding protrusion may be formed to protrude lower than the first welding protrusion.

The lead part may include: a first lead facing the electrode terminals of the battery cells; and a second lead disposed to be bent from the first leads, wherein the first welding protrusion and the second welding protrusion may be formed on the first lead and the second lead, respectively.

The lead part may be provided in plurality, and at least two lead parts among the plurality of lead parts may extend onto the electrode terminals.

In accordance with still another exemplary embodiment, a method for manufacturing a battery pack, the method includes: welding a first welding protrusion formed to protrude from each of a plurality of lead parts to an electrode terminal of each of a plurality of battery cells; checking a welded state between the first welding protrusion and the electrode terminal; and when the welded state between the first welding protrusion and the electrode terminal is defective, welding, to the electrode terminal, a second welding protrusion formed to protrude from each of the lead part and disposed to be spaced apart from the electrode terminal.

In the welding of the first welding protrusion to the electrode terminals, the first welding protrusion protruding from each of the plurality of lead parts may be welded to the electrode terminal of each of the plurality of battery cells.

In the welding of the first welding protrusion to the electrode terminal, a current may be caused to flow between two lead parts extending to the electrode terminal, whereby the first welding protrusion formed in each of the two lead parts may be welded to the electrode terminal.

The checking of a welded state of the first welding protrusion and the electrode terminal may include: measuring a voltage of each of the battery cells via each of the lead parts; and comparing the measured voltage with a preset voltage and determining whether the welded state is defective.

In the welding of the second welding protrusion to each of the electrode terminals, each of the lead parts may be deformed and welded so that the second welding protrusion disposed to be spaced apart from each of the electrode terminals may contact each of the electrode terminals.

In the welding of the first welding protrusion to each of the electrode terminals, a current may be caused to flow between two lead parts extending to the electrode terminals, whereby the second welding protrusion formed in each of the two lead parts may be welded to each of the electrode terminals.

Advantageous Effects

In accordance with an exemplary embodiment, a busbar for connecting battery cells, a battery pack, and a method for manufacturing the battery pack are provided with: second welding protrusions for being welded to the respective electrode terminals of respective battery cells aside from first welding protrusions for being welded to the respective electrode terminals, and thus, even when a welding defect occurs in the first welding protrusions, stable connection may be achieved via the second welding protrusions.

In addition, the second welding protrusions are disposed to be spaced apart from the respective electrode terminals of the battery cells when checking the welded states of the first welding protrusions, the welded state between the first welding protrusions and the respective electrode terminals may be checked without an error, and guide grooves for guiding the deformation of respective lead parts may be formed in at least one surface of the respective lead parts, and thus, when the welding of the first welding protrusions is defective, the second welding protrusions may easily be brought into contact with the respective electrode terminals.

MODE FOR CARRYING OUT THE INVENTION

Figure 1:
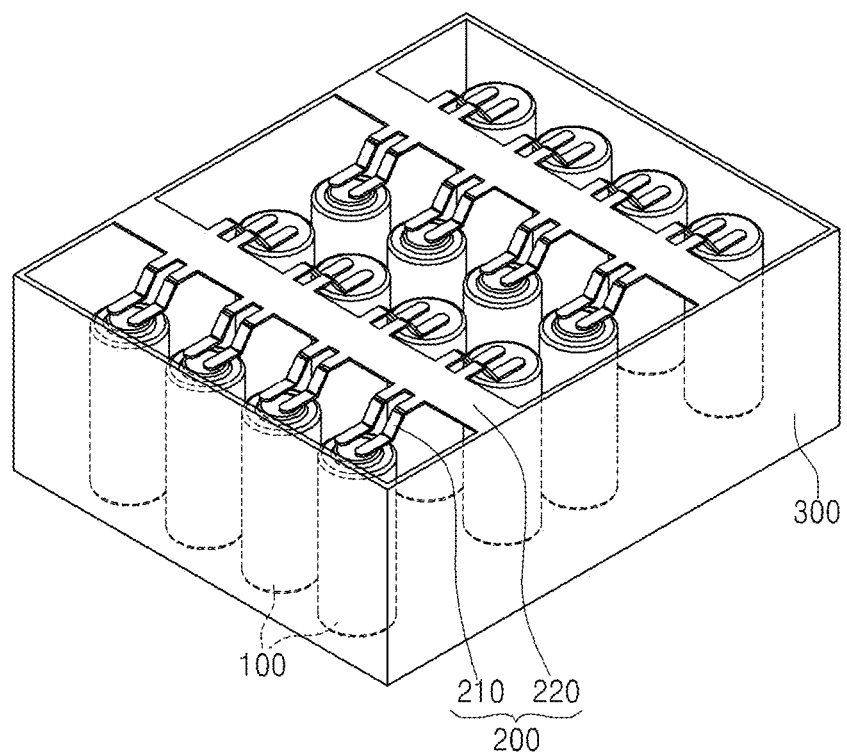
FIG. 1 is a view schematically illustrating a battery pack in accordance with an exemplary embodiment.

Hereinafter, exemplary embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. In the drawings, like reference numerals refer to like elements throughout.

FIG. 1 is a view schematically illustrating a battery pack in accordance with an exemplary embodiment.

Referring to FIG. 1, a battery pack in accordance with an exemplary embodiment includes: a plurality of battery cells 100; and busbars 200 for electrically connecting the plurality of battery cells 100.

The battery cells 100 may be provided in plurality in order to increase the output and capacity of the battery pack. In addition, the battery cells 100 may include secondary battery cells having cylindrical shapes. In this case, the cylindrical secondary battery cells may be provided in a form of accommodating, inside a case, an electrode assembly in which a positive electrode separator and a negative electrode plate are wound in a jelly roll shape by interposing a separator between a positive electrode plate to which a positive electrode tab is attached and the negative electrode plate to which a negative electrode tab is attached.

These battery cells 100 may each have electrode terminals on one side and the other side reverse from the one side, and a positive electrode terminal may be formed on the one side and a negative electrode terminal may be formed on the other side.

The plurality of battery cells 100 may be accommodated in a frame 300. Here, the frame 300 may have a plurality of openings formed therein corresponding to the shapes of the battery cells 100, and the battery cells 100 may be accommodated in the plurality of respective openings so that the electrode terminals are exposed to the outside. At this point, the plurality of openings may be formed so as to be arranged in a row direction or a column direction. In the openings arranged in the row direction, the battery cells 100 may be accommodated so that the same electrode terminals, for example, the positive electrode terminals, are exposed, and in the openings arranged in the column direction, the battery cells 100 may be accommodated so that the electrode terminals having mutually different polarities, for example, the positive electrode terminals and the negative electrode terminals, are alternately exposed. That is, the plurality of battery cells 100 accommodated in the plurality of openings may be connected in parallel in the row direction, and the battery cells connected in parallel in the row direction may be connected to each other in series.

The busbars 200 are the busbars 200 for connecting battery cells provided for electrically connecting the plurality of battery cells 100 to each other, and each include a body part 220 composed of a conductive material and lead parts 210 extending from the body part 220.

The body part 220 may be composed of a metallic material having high electrical conductivity, and be formed to extend in the row direction in an upper or lower side between the openings arranged in the row direction and the openings arranged adjacent to the openings and arranged in the row direction. In addition, the body part 220 may be formed so that the plurality of the body parts are electrically connected to each other, and be electrically connected to the positive electrode terminals (not shown) and the negative electrode terminals (not shown) of the battery pack. The electrical connection structures between the body parts 220 and the positive electrode terminals and the negative electrode terminals of the battery pack may be variously changed and applied, and the illustration and specific descriptions thereon will not be provided.

The lead parts 210 may be formed so as to extend from the respective body parts 220 onto the electrode terminals of the respective battery cells 100, and be provided in plurality so as to extend onto the electrode terminals of the plurality of respective battery cells 100.

Here, as illustrated in FIG. 1, at least two lead parts 210 among the plurality of lead parts 210 may be formed to extend onto one electrode terminal of a battery cell 100. That is, as described later, the lead parts 210 may have welding protrusions formed to protrude therefrom, and in order to resistively weld the welding protrusions to the electrode terminals of respective battery cells 100, at least two lead parts 210 among the plurality of lead parts 210 are required to be formed to extend onto the one electrode terminal of the battery cell 100. In this case, the welding protrusions may be formed on the at least two lead parts 210, and a current is caused flow between the at least two lead parts 210 extending onto the electrode terminal, and thus, the welding protrusions formed on the respective lead parts 210 may be welded to the one electrode terminal of the battery cell 100.

In the battery pack in accordance with an exemplary embodiment, the busbars 200 each include; first welding protrusions formed on the respective lead parts 210 and joined to electrode terminals of the respective battery cells 100; and second welding protrusions formed on the respective lead parts 210 and arranged so as to be spaced apart from the one electrode terminals.

That is, in order to electrically connect the plurality of battery cells 100, each of the first welding protrusions formed on a lead part 210 is welded and joined to one electrode terminal of a battery cell 100, and when a welding defect occurs in the welding process of the first welding protrusion between the first welding protrusion and the one electrode terminal of the battery cell 100, a problem occurs in which the manufactured battery pack should be entirely discarded.

Thus, in the battery pack in accordance with an exemplary embodiment, the second welding protrusion is formed on a lead part 210 on which a first welding protrusion is formed so as to be spaced apart from the electrode terminal of a battery cell 100, and when a welding defect occurs between the first welding protrusion and the electrode terminal of the battery cell 100, the second welding protrusion may be brought into contact with and welded to the electrode terminal. That is, the second welding protrusion functions as a spare in preparation for the case in which a welding defect occurs between the first welding protrusion and the electrode terminal of the battery cell 100.

The battery pack in accordance with an exemplary embodiment is provided with the spare second welding protrusions aside from the first welding protrusions, and thus, even when a welding defect occurs between a first welding protrusion and one electrode terminal of a battery cell 100, the electrode terminal on which the welding defect has occurred and a second welding terminal are welded without discarding the battery pack, so that the plurality of battery cells 100 may be electrically connected in a stable manner.

In this case, the second welding protrusion is required to be arranged so as to be spaced apart from the electrode terminal of the battery cell 100 before determining whether the welding of the first welding protrusion is defective. That is, in order to check the welded state of the first welding protrusion and the electrode terminal, the voltage of the battery cell 100 is measured via the lead part 210 on the first welding protrusion, and at this point, when the second welding protrusion contacts the electrode terminal, the second welding protrusion and the electrode terminal are electrically connected and the welded state of the first welding protrusion and the electrode terminal cannot be checked. Thus, the second welding protrusion is arranged so as to be spaced apart from the electrode terminal of the battery cell 100 before determining whether the welding of the first welding protrusion is defective.

As such, in order to arrange the second welding protrusions on sides of the respective first welding protrusions so as to be spaced apart from the electrode terminals, the first welding protrusions and the second welding protrusions are formed so as to face the respective electrode terminals, and the second welding protrusions may be formed (first embodiment) so as to protrude lower than the respective first protrusions. In addition, in order to arrange the second welding protrusions on sides of the respective first welding protrusions so as to be spaced apart from the respective electrode terminals, the lead parts 210 may each include a first lead facing the electrode terminal and a second lead arranged to be bent from the first lead, and the first welding protrusions and the second welding protrusions may be formed on the respective first lead part and the second lead part and protrude (second embodiment) in mutually different directions.

Hereinafter, the structure of a busbar for connecting the battery cells included in a battery pack in accordance with an exemplary embodiment will be described in detail. In describing a busbar for connecting battery cells, overlapped descriptions with the above-mentioned content pertaining to the battery pack in accordance with an exemplary embodiment will not be provided.

First Embodiment

Figure 2:
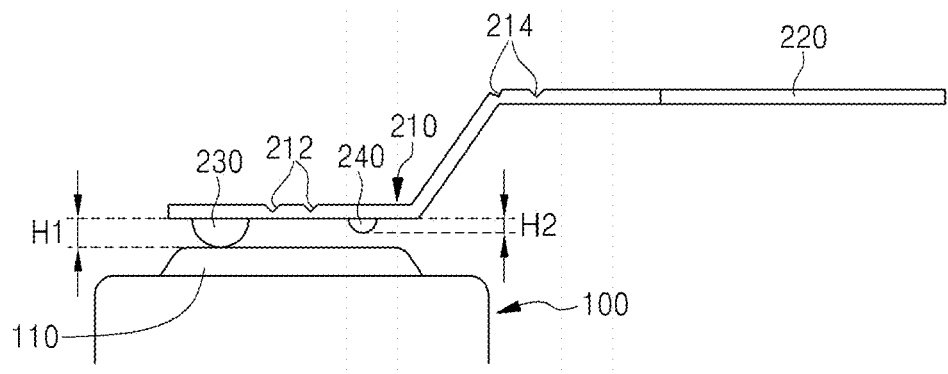
FIG. 2 is a view illustrating a state in which a first welding protrusion of a busbar for connecting battery cells in accordance with a first exemplary embodiment is welded to an electrode terminal of a battery cell.
Figure 3:
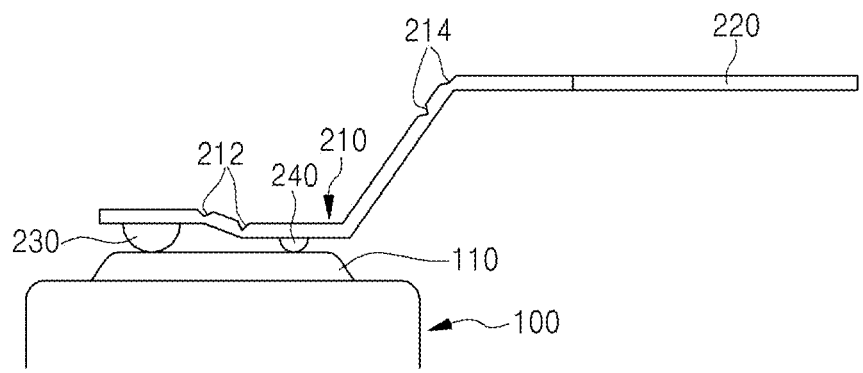
FIG. 3 is a view illustrating a state in which a second welding protrusion of a busbar for connecting battery cells in accordance with a first exemplary embodiment is welded to an electrode terminal of a battery cell.

FIG. 2 is a view illustrating a state in which a first welding protrusion 230 of a busbar 200 for connecting battery cells in accordance with first embodiment is welded to an electrode terminal 110 of a battery cell 100, and FIG. 3 is a view illustrating a state in which a second welding protrusion 240 of the busbar 200 for connecting battery cells in accordance with first embodiment is welded to the electrode terminal 110 of the battery cell 100.

Referring to FIGS. 2 and 3, the busbar 200 for connecting battery cells in accordance with first embodiment includes: a body part 220 composed of a conductive material; a lead part 210 extending from the body part 220; a first welding protrusion 230 formed to protrude from the lead part 210 so as to be welded to the electrode terminal 110 of a battery cell 100; and a second welding protrusion formed to protrude from the lead part 210 so as to be welded to the electrode terminal 110 of the battery cell 100, wherein the second welding protrusion 240 is formed to protrude lower than the first welding protrusion 230.

The body part 220 may be composed of a metallic material having high electrical conductivity in order to electrically connect the plurality of battery cells. The lead part 210 may be integrally formed with the body part 220 so as to extend from the body part 220 onto the electrode terminal 110 of the battery cell 100, and be provided in plurality so as to extend onto the electrode terminals 110 of the plurality of respective battery cells 100. In addition, as described above, at least two lead parts 210 among the plurality of lead parts 210 may be formed to extend onto one electrode terminal 110 of the battery cell 100 for resistance welding.

The first welding protrusion 230 may be formed to protrude from the lead part 210 in order to be welded to the electrode terminal 110 of the battery cell 100. In addition, the second welding protrusion 240 may be formed to protrude from the lead part 210 in order to be welded to the electrode terminal 110. At this point, the second welding protrusion 240 may arranged so as to be spaced apart from the first welding protrusion 230 toward one side of the first welding protrusion 230, and be formed so as to face the electrode terminal 110 of the battery cell 100, and the second welding protrusion 240 may be formed to protrude lower than the first welding protrusion 230.

That is, the first welding protrusion 230 and the second welding protrusion 240 may be formed so as to protrude from the lead part 210 toward the electrode terminal 110 of the battery cell 100, and at this point, the protruding height H1 of the first welding protrusion 230 may be formed lower than the protruding height H2 of the second welding protrusion 240. In addition, the first welding protrusion 230 and the second welding protrusion 240 may be integrally formed with the lead part 210 such that the upper surface of the lead part 210 is recessed and the lower surface of the lead part 210 protrudes. In this case, a welding electrode is positioned on the recessed upper surface of the lead part 210 during welding of each welding protrusion, and may thus easily weld the protrusions to the electrode terminal 110.

As such, the protruding height H1 of the first welding protrusion 230 is formed lower than the protruding height H2 of the second welding protrusion 240, and thus, as illustrated in FIG. 2, the first welding protrusion 230 is brought into contact with the electrode terminal 110 of the battery cell 100 and the second welding electrode 240 may be arranged so as to be spaced apart from the electrode terminal 110. Subsequently, the first welding protrusion 230 is welded to the electrode terminal 110, and in FIG. 2, the state in which the first welding protrusion 230 is being welded is not illustrated, but the first welding protrusion 230 may of course be joined to the electrode terminal 110 such that a portion of the lower end of the first welding protrusion is melted.

Here, the second welding protrusion 240 may be formed on the lead part 210 at a position more adjacent to the body part 220 than the first welding protrusion 230. That is, the second welding protrusion 240 may be disposed on the lead part 210 to be spaced apart a certain distance toward the body part 220 from the first welding protrusion positioned at the end section of the lead part 210. As such, the second welding protrusion 240 is disposed at a position more adjacent to the body part 220 than the first welding protrusion 230, and thus, the second welding protrusion 240 may be easily maintained at a state of being spaced apart from the electrode terminal 110 by means of the tension of the lead part 210, both ends of which are fixed by the first welding protrusion 230 and the body part.

Such welding of the first welding protrusion 230 and the electrode terminal 110 may be performed with respect to the plurality of battery cells 100. That is, the first welding protrusions 230 formed to protrude from the plurality of respective lead parts 210 are welded to the electrode terminals 110 of the plurality of respective battery cells 100. When the welding of the first welding protrusion 230 and the electrode terminal 110 of each of the plurality of battery cells 100 is completed, the welded states of the first welding protrusions 230 and the electrode terminals of the respective battery cells 100 are then checked.

When it is checked that the first welding protrusions 230 and the electrode terminals 110 of the plurality of respective battery cells 100 are normally welded, the normal remaining processes are performed for the manufacturing of the battery pack. However, when it is checked that the welding between a first welding protrusion 230 and an electrode terminal 110 of a battery cell 100 is defective, the corresponding second welding protrusion 240 is welded to the electrode terminal 110 of the battery cell 100 as illustrated in FIG. 3.

That is, when the welding between a first welding protrusion 230 and an electrode terminal 110 of a battery cell 100 is defective, the lead part 210 may be pressed downward on the second welding protrusion 240 At this point, the lead part 210 may be bent between the first welding protrusion 230 and the second welding protrusion 240, and thus, the second welding protrusion 240 is brought into contact with the electrode terminal 110. As such, after the second welding protrusion 240 contacts the electrode terminal 110 of the battery cell 100, the second welding protrusion 240 is welded to the electrode terminal 110, and although the state in which the second welding protrusion 240 is welded is not illustrated in FIG. 3, the second welding protrusion 240 may, of course, be joined to the electrode terminal 110 such that a portion of the lower end thereof is melted by the welding.

Here, a guide groove may be formed in at least a surface of the lead part 210 in a direction crossing the direction in which the lead part 210 extends from the body part 220. For example, as illustrated in FIGS. 2 and 3, the guide hole may be formed such that the upper surface of the lead part 210 is recessed a predetermined distance, and the guide groove may, of course, be formed in the lower surface of the lead part 210 or in both the upper and lower surfaces of the lead part 210. In addition, the guide groove may include: a first guide groove 212 positioned between the first welding protrusion 230 and the second welding protrusion 240; and a second guide groove 214 positioned between the second welding protrusion 240 and the body part 220, and at this point, at least one of the first guide groove 212 and the second 214 may be formed in plurality.

In FIGS. 2 and 3, the state in which two first guide grooves 212 are formed between the first welding protrusion 230 and the second welding protrusion 240, and the state in which the two second guide grooves 214 are formed between the second welding protrusion 240 and the body part 220, but the positions and the numbers of the first guide grooves 212 and the second guide grooves 214 may, of course, be variously formed in order to easily bring the second welding protrusion 240 into contact with the electrode terminal 110 of the battery cell 100 when pressing the lead part 210.

Second Embodiment

Figure 4:
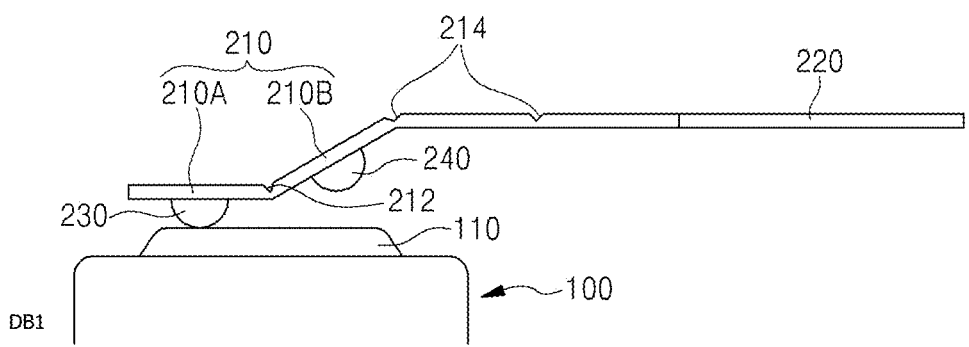
FIG. 4 is a view illustrating a state in which a first welding protrusion of a busbar for connecting battery cells in accordance with a second exemplary embodiment is welded to an electrode terminal of a battery cell.
Figure 5:
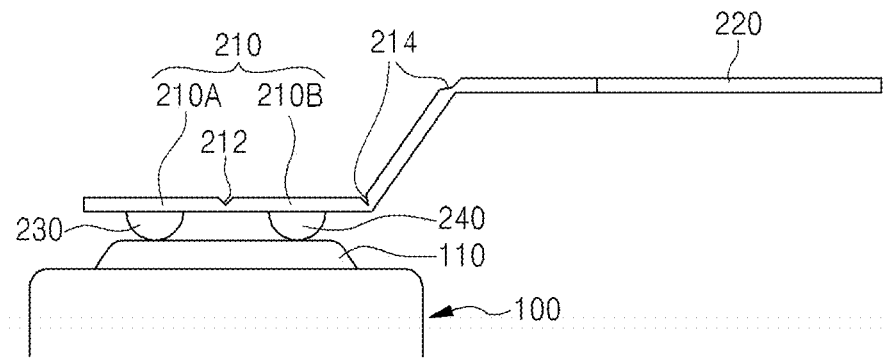
FIG. 5 is a view illustrating a state in which a first welding protrusion of a busbar for connecting battery cells in accordance with a second exemplary embodiment is welded to an electrode terminal of a battery cell.

FIG. 4 is a view illustrating a state in which a first welding protrusion 230 of a busbar 200 for connecting battery cells in accordance with second embodiment is welded to an electrode terminal 110 of a battery cell 100, and FIG. 5 is a view illustrating a state in which a second welding protrusion 240 of the busbar 200 for connecting battery cells in accordance with second embodiment is welded to the electrode terminal 110 of the battery cell 100.

Referring to FIGS. 4 and 5, the busbar 200 for connecting battery cells in accordance with second embodiment includes: a body part 220 composed of a conductive material; a lead part 210 extending from the body part 220; a first welding protrusion 230 formed to protrude from the lead part 210 so as to be welded to the electrode terminal 110 of a battery cell 100; and a second welding protrusion formed to protrude from the lead part 210 so as to be welded to the electrode terminal 110 of the battery cell 100, wherein the second welding protrusion 240 is formed to protrude in a different direction from the protruding direction of the first welding protrusion 230.

The body part 220 may be composed of a metallic material having high electrical conductivity in order to electrically connect the plurality of battery cells 100 in the same manner as described above. The lead part 210 may be integrally formed with the body part 220 so as to extend from the body part 220 onto the electrode terminal 110 of the battery cell 100, and be provided in plurality so as to extend onto the electrode terminals 110 of the plurality of respective battery cells 100. In addition, as described above, at least two lead parts 210 among the plurality of lead parts 210 may be formed to extend onto one electrode terminal 110 of the battery cell 100 for resistance welding.

The first welding protrusion 230 may be formed to protrude from the lead part 210 in order to be welded to the electrode terminal 110 of the battery cell 100. In addition, the second welding protrusion 240 may be formed to protrude from the lead part 210 in order to be welded to the electrode terminal 110. At this point, the second welding protrusion 240 is formed so as to protrude in a different direction from the protruding direction of the first protrusion 230.

To this end, the lead part 210 may include: a first lead 210A facing the electrode terminal 110 of the battery cell 100; and a second lead 210B disposed to be bent from the first lead 210A, wherein the first welding protrusion 230 and the second welding protrusion 240 may be formed on the first lead 210A and the second lead 210B, respectively. In addition, the first welding protrusion 230 and the second welding protrusion 240 may be integrally formed with the lead part 210 such that the upper surface of the lead part 210 is recessed and the lower surface of the lead part 210 protrudes, and in this case, as described above, a welding electrode is positioned on the recessed upper surface of the lead part 210 when welding the welding protrusions, so that the welding protrusions are easily welded to the electrode terminal 110.

As such, the first welding protrusion 230 is formed on the first lead 210A facing the electrode terminal 110 of the battery cell 100, and the second welding protrusion 240 is formed on the second lead 210B disposed to be bent, for example, upward from the first lead 210A, and thus, as illustrated in FIG. 4, the first welding protrusion 230 may contact the electrode terminal 110 of the battery cell 100 and the second welding protrusion 240 may be disposed so as to be spaced apart from the electrode terminal 110. Subsequently, the first welding protrusion 230 is welded to the electrode terminal 110, and in FIG. 4, the state in which the first welding protrusion 230 is being welded is not illustrated, but the first welding protrusion 230 may, of course, be joined to the electrode terminal 110 such that a portion of the lower end of the first welding protrusion is melted.

In addition, the second welding protrusion 240 may be formed on the lead part 210 at a position more adjacent to the body part 220 than the first welding protrusion 230. That is, the second welding protrusion 240 may be disposed on the lead part 210 to be spaced apart a certain distance toward the body part 220 from the first welding protrusion 230 positioned at the end section of the lead part 210. As such, the second welding protrusion 240 is disposed at a position more adjacent to the body part 220 than the first welding protrusion 230, and thus, the second welding protrusion 240 may be easily maintained at a state of being spaced apart from the electrode terminal 110 by means of the tension of the lead part 210, both ends of which are fixed by the first welding protrusion 230 and the body part.

Meanwhile, when the welding between the first welding protrusion 230 and the electrode terminal 110 of each of the plurality of battery cells 100 is completed, the welded states of the first welding protrusions 230 and the electrode terminals 110 of the respective battery cells 100 are then checked.

When it is checked that the first welding protrusions 230 and the electrode terminals 110 of the plurality of respective battery cells 100 are normally welded, the normal remaining processes are performed for the manufacturing of a battery pack. However, when it is checked that the welding between a first welding protrusion 230 and an electrode terminal 110 of a battery cell 100 is defective, the corresponding second welding protrusion 240 is welded to the electrode terminal 110 of the battery cell 100 as illustrated in FIG. 5.

That is, when the welding between a first welding protrusion 230 and an electrode terminal 110 of a battery cell 100 is defective, the lead part 210 may be pressed downward on the second welding electrode. At this point, the first lead and the second lead disposed while forming a predetermined angle may be disposed on the same plane, and thus, the second welding protrusion 240 may contact the electrode terminal 110 of the battery cell 100. As such, after the second welding protrusion 240 contacts the electrode terminal 110 of the battery cell 100, the second welding protrusion 240 is welded to the electrode terminal 110, and although the state in which the second welding protrusion 240 is welded is not illustrated in FIG. 5, the second welding protrusion 240 may, of course, be joined to the electrode terminal 110 such that a portion of the lower end thereof is melted by the welding.

Here, a guide groove may be formed in at least one surface of the lead part 210 in a direction crossing the direction in which the lead part 210 extends from the body part 220, and the guide groove may include: a first guide groove 212 positioned between the first welding protrusion 230 and the second welding protrusion 240; and a second guide groove 214 positioned between the second guide groove 214 and the body part 220. In addition, at this point, at least one of the first guide groove 212 and the second guide groove 214 may be formed in plurality as described above.

In FIGS. 4 and 5, the state in which two first guide grooves 212 are formed between the first welding protrusion 230 and the second welding protrusion 240, and the state in which the two second guide grooves 214 are formed between the second welding protrusion 240 and the body part 220, but the positions and the numbers of the first guide grooves 212 and the second guide grooves 214 may, of course, be variously formed in order to easily bring the second welding protrusion 240 into contact with the electrode terminal 110 of the battery cell 100 when pressing the lead part 210.

Hereinafter, a method for manufacturing a battery pack in accordance with an exemplary embodiment will be described in detail. In describing a method for manufacturing a battery pack, overlapped descriptions with the abovementioned content pertaining to the busbar and the battery pack in accordance with an exemplary embodiment will not be provided.

Figure 6:
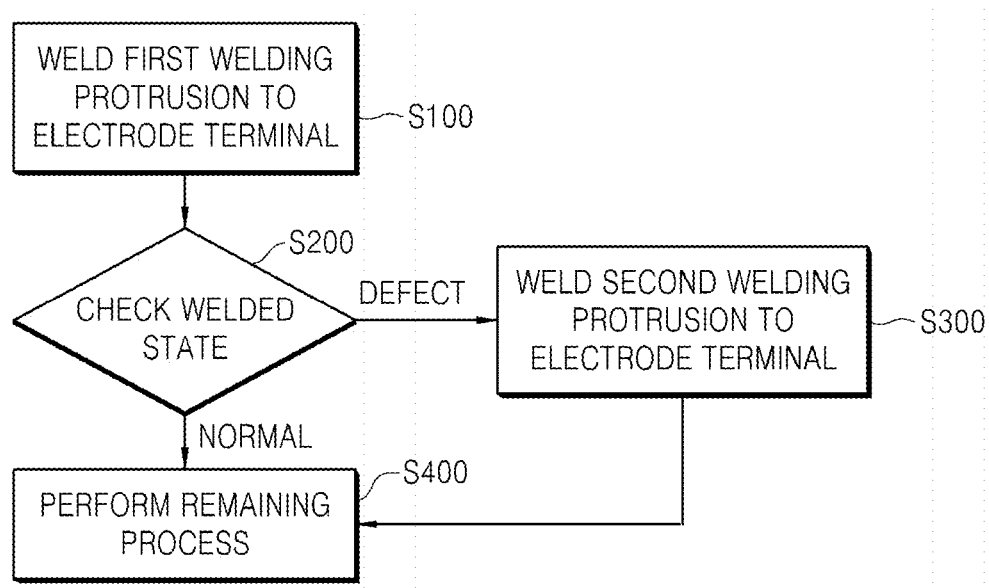
FIG. 6 is a view schematically illustrating a method for manufacturing a battery pack in accordance with an exemplary embodiment.

FIG. 6 is a view schematically illustrating a method for manufacturing a battery pack in accordance with an exemplary embodiment.

Referring to FIG. 6, a method for manufacturing a battery pack in accordance with an exemplary embodiment includes: welding first welding protrusions 230 formed to prude from respective lead parts 210 to respective electrode terminals of respective battery cells 100 (S100); checking welded states between the first welding protrusions 230 and the respective electrode terminals 110 (S200); and welding second welding protrusions 240, formed to protrude from the respective lead parts 210 and disposed to be spaced apart from the respective electrode terminals 110, to the respective electrode terminals 110 when the welding between the first welding protrusions and the respective electrode terminals 110 are defective (S300).

In the welding of the first welding protrusions 230 formed to prude from the respective lead parts 210 to the respective electrode terminals 110 of the respective battery cells 100 (S100), the first welding protrusions 230 formed to protrude from the respective lead parts 210 are welded to the respective electrode terminals 110 of the respective battery cells 100. At this point, the lead parts 210 may be provided to busbars 200, and formed to extend from the respective body parts 220 onto the respective electrode terminals 110 of the respective battery cells 100, and the first welding protrusions 230 and the second welding protrusions 240 are formed on the lower surfaces of the lead parts 210 so as to protrude toward the respective electrode terminals 110. In the welding of the first welding protrusions 230 to the respective electrode terminals 110 of the respective battery cells (S100), the first welding protrusions 230 are brought into contact with and welded to the respective electrode terminals 110 of the respective battery cells 100, and the second welding protrusions 240 are disposed to be spaced apart from the respective electrode terminals 110.

In the welding of the first welding protrusions 230 formed to prude from the respective lead parts 210 to the respective electrode terminals 110 of the respective battery cells 100 (S100), the first welding protrusions 230 formed to protrude from the plurality of respective lead parts 210 are welded to the respective electrode terminals 110 of the plurality of respective battery cells 100. In addition, in this case, at least two lead parts 210 among the plurality of lead parts 210 may extend onto one electrode terminal 110, and at this point, in the welding of the first welding protrusions 230 to the respective electrode terminals 110 of the respective battery cells 100 (S100), a current is caused to flow between the two lead parts extending onto the electrode terminal 110, and thus, the first welding protrusions 230 formed on the two respective lead parts 210 may be welded to the electrode terminal 110.

In the checking of welded states between the first welding protrusions 230 and the respective electrode terminals 110 (S200), whether the welding between the first welding protrusions 230 and the respective electrode terminals 110 is normal or defective is checked. In this case, the checking of welded states between the first welding protrusions 230 and the respective electrode terminals 110 (S200) may include: measuring voltages of the respective battery cells 100 via the respective lead parts 210; and comparing the measured voltages and the preset voltages to determine whether the welded states are defective.

The measuring of the voltages of the respective battery cells 100 via the respective lead parts 210 may be performed by measuring open circuit voltages of the battery cells via the lead parts 210. In this case, the open circuit voltages between the lead parts 210, in which the first welding protrusions 230 are welded to the respective electrode terminals 110 of the respective battery cells 100, and the other of the respective electrode terminals of the respective battery cells 100 may be measured.

In the determining of whether the welded states are defective, measured voltages and respective preset voltages are compared to determine whether the welded states are defective. That is, when the first welding protrusions 230 are normally welded to the respective electrode terminals of the respective battery cells 100, the battery cells 100 exhibit a constant voltage. However, when the first welding protrusions 230 are defectively welded to the respective electrode terminals of the respective battery cells 100, the battery cells 100 exhibit relatively low voltages than those in the case of normal welding. Thus, the voltage in the case when the first welding protrusions 230 are normally welded to the respective electrode terminals 110 of the respective battery cells 100, or a voltage having a predetermined difference from the voltage is set as critical voltage in advance, and when the measured voltage does not reach the critical voltage, the welded states between the first welding protrusions 230 and the respective electrode terminals 110 may be determined to be defective.

Here, when it is checked that the first welding protrusions 230 and the respective electrode terminals 110 of the plurality of respective battery cells 100 are normally welded, the normal remaining processes are performed for the manufacturing of a battery pack (S400). However, when it is checked that the welding between the first welding protrusions 230 and the respective electrode terminals 110 of the respective battery cells 100 are defective, the welding of the second welding protrusions 240 to the respective electrode terminals 110 (S300) is performed.

Here, before the welding of the second welding protrusions 240 to the respective electrode terminals 110 (S300), the second welding protrusions 240 are disposed to be spaced apart from the respective electrode terminals 110 of the respective battery cells 100. Thus, in the welding of the second welding protrusions 240 to the respective electrode terminals 110 (S300), the second welding protrusions 240 disposed to be spaced apart from the respective electrode terminals 110 of the respective battery cells 100 are brought into contact with the respective electrode terminals 110, and such contact between the second welding protrusions 240 and the respective electrode terminals 110 is performed by deforming the respective lead parts 210 as described above.

That is, in case of first embodiment described above in which the second welding protrusions 240 are formed lower than the first welding protrusions 230, the respective lead parts 210 are deformed to be bent and the second welding protrusions 240 may be brought into contact with the respective electrode terminals 110, and in case of second embodiment, in which the first welding protrusions 230 and the second welding protrusions 240 are formed to protrude in mutually different directions, the respective lead parts 210 are deformed so as to form the same plane in a bent state and the second welding protrusions 240 and the electrode terminals are brought into contact with each other.

Subsequently, in the welding of the second welding protrusions 240 to the respective electrode terminals 110 (S300), a current is caused to flow between two lead parts 210 extending onto an electrode terminal, so that the second welding protrusions 240 formed on the two lead parts 210 may be welded to the electrode terminal 110 by means of resistance welding in the same manner as that described in the case of the first welding protrusions 230.

As such, in a busbar for connecting battery cells, a battery pack, and a method for manufacturing the battery pack in accordance with an exemplary embodiment, aside from first welding protrusions for being welded to the respective electrode terminals 110 of respective battery cells 100, second welding protrusions 240 for welded to the respective electrode terminals 110 are provided, and thus, even when a welding defect occurs in the first welding protrusions 230, a stable contact with the respective electrode terminals 110 may be achieved through the second welding protrusions 240.

In addition, the second welding protrusions 240 are disposed to be spaced apart from the respective electrode terminals 110 of the respective battery cells 100 when checking the welded states of the first welding protrusions 230, so that the welded states between the first welding protrusions 230 and the respective electrode terminals 110 may be checked without an error, and guide holes 212 and 214 for guiding the deformation of the lead parts 210 are formed in at least one surface of each of the lead parts 210, the second welding protrusion 240 may easily be brought into contact with the electrode terminal 110 when the welding of the first welding protrusion is defective.

So far, preferred embodiments have been described and illustrated suing specific terms, but such terms are used to clearly describe the present disclosure, and it is obvious that exemplary embodiments and described terms may be variously modified and changed without departing from the spirit and scope of the present disclosure. Such variously modified embodiments should not be interpreted separate from the spirit and scope of the present disclosure, and but to be included in the claims of the present disclosure.

What is claimed is:

1. A busbar for connecting battery cells comprising:
a body part composed of a conductive material;
a lead part extending from the body part in a first direction;
a first welding protrusion protruding from a lower surface of the lead part and configured to be welded to an electrode terminal of one of the battery cells; and
a second welding protrusion protruding from the lower surface the lead part and configured to be welded to the electrode terminal, the second welding protrusion being closer to the body part than the first welding protrusion,
wherein the second welding protrusion is disposed to protrude from the lower surface of the lead part by a second protruding height less than a first protruding height of the first welding protrusion from the lower surface of lead part.

2. The busbar of claim 1, wherein the first welding protrusion and the second welding protrusion each face the electrode terminal.

3. The busbar of claim 1, wherein at least one guide groove across at least one of an upper surface and the lower surface of the lead part for being the lead part along the at least one guide groove, the at least one guide groove being in a second direction perpendicular to the first direction.

4. The busbar of claim 3, wherein the at least one guide groove comprises:
a first guide groove between the first welding protrusion and the second welding protrusion; and
a second guide groove between the second welding protrusion and the body part.

5. The busbar of claim 4, wherein at least one of the first guide groove and the second guide groove is formed in plurality.

6. A busbar for connecting battery cells comprising:
a body part of a conductive material;
a lead part extending from the body part in a first direction;
a first welding protrusion protruding from the lead part and configured to be welded to an electrode terminal of one of the battery cells; and
a second welding protrusion protruding from the lead part, the second welding protrusion being closer to the body part than the first welding protrusion,
wherein the second welding protrusion is disposed to protrude in a different direction from the first welding protrusion.

7. The busbar of claim 6, wherein the lead part comprises:
a first lead configured to face the electrode terminal; and
a second lead disposed to be bent from the first lead such that the second lead is slanted relative to the first lead,
wherein the first welding protrusion and the second welding protrusion are on the first lead and the second lead, respectively.

8. The busbar of claim 6, wherein the lead part includes:
a first guide groove across one of an upper surface and the lower surface of the lead part to be disposed in a second direction perpendicular to the first direction for bending the lead part at the first guide groove, the first guide groove being between the first welding protrusion and the second welding protrusion; and
a second guide groove across one of the upper surface and the lower surface of the lead part to be disposed in the second direction for bending the lead part at the second guide groove, the second guide groove being between the second welding protrusion and the body part.

9. A battery pack comprising:
a plurality of battery cells; and
a busbar for electrically connecting the plurality of battery cells, wherein the busbar comprises:
a body part of a conductive material;
a lead part extending from the body part in a first direction onto an electrode terminal of one of the battery cells;
a first welding protrusion protruding from a lower surface of the lead part and joined to the electrode terminal; and
a second welding protrusion protruding from the lower surface of the lead part and spaced apart from the electrode terminal, wherein the second welding protrusion is disposed to protrude from the lower surface of the lead part by a second protruding height less than a first protruding height of the first welding protrusion from the lower surface of lead part.

10. The battery pack of claim 9, wherein the first welding protrusion and the second welding protrusion each face the electrode terminal.

11. The battery pack of claim 9, wherein the lead part comprises:
a first lead facing the electrode terminal; and
a second lead disposed to be bent from the first lead, such that the second lead is slanted relative to the first lead,
wherein the first welding protrusion and the second welding protrusion are on the first lead and the second lead, respectively.

12. The battery pack of claim 9, wherein the lead part includes a plurality of lead parts, and at least two lead parts among the plurality of lead parts extend onto the electrode terminals.

13. A method for manufacturing a battery pack, the method comprising:
welding a first welding protrusion protruding from a first lead part of a plurality of lead part to a respective electrode terminal of battery cell of the battery pack;
checking a welded state between the first welding protrusion and the electrode terminal; and
when the welded state between the first welding protrusion and the electrode terminal is defective, welding, to the electrode terminal, a second welding protrusion protruding from the first lead part and spaced apart from the first welding protrusion such that both the first and the second welding protrusions remaining in contact with the electrode terminal.

14. The method of claim 13, wherein, in the welding of the first welding protrusion to the electrode terminal, a current is caused to flow between the first lead part and a second lead part, whereby the first welding protrusion of the first lead part is welded to the electrode terminal.

15. The method of claim 13, wherein the checking of the welded state comprises:
measuring a voltage of the battery cell via each of the first lead part; and
comparing the measured voltage with a preset voltage and determining whether the welded state is defective.

16. The method of claim 13, wherein, in the welding of the second welding protrusion, the first lead part is deformed and welded so that the second welding protrusion disposed to be spaced apart from the electrode terminal contacts the electrode terminal.

17. The method of claim 13, wherein, in the welding of the second welding protrusion to the electrode terminal, a current is caused to flow between the first lead part and a second lead part, whereby the second welding protrusion of the first lead part is welded to the electrode terminal.

* * * * *